US006593171B2

(12) United States Patent
Farnworth

(10) Patent No.: US 6,593,171 B2
(45) Date of Patent: *Jul. 15, 2003

(54) STEREOLITHOGRAPHIC METHODS FOR FABRICATING HERMETIC SEMICONDUCTOR DEVICE PACKAGES AND SEMICONDUCTOR DEVICES INCLUDING STEREOLITHOGRAPHICALLY FABRICATED HERMETIC PACKAGES

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/074,840

(22) Filed: Feb. 13, 2002

(65) Prior Publication Data

US 2002/0096805 A1 Jul. 25, 2002

Related U.S. Application Data

(62) Division of application No. 09/640,801, filed on Aug. 17, 2000, now Pat. No. 6,432,752.

(51) Int. Cl.[7] .................. H01L 21/44; H01L 21/48; H01L 21/50

(52) U.S. Cl. .................. 438/127; 438/110; 438/111; 438/112; 438/113; 438/121; 438/123; 438/124; 438/125; 438/126; 438/778; 438/780; 438/781

(58) Field of Search .................. 438/110–113, 121, 438/123–127, 778, 780, 781

(56) References Cited

U.S. PATENT DOCUMENTS

| 3,325,586 A | 6/1967 | Suddlick |
| 4,133,690 A | 1/1979 | Muller |
| 4,314,031 A | 2/1982 | Sanford et al. |
| 4,468,411 A | 8/1984 | Sloan et al. |
| 4,863,538 A | 9/1989 | Deckard |
| 4,944,817 A | 7/1990 | Bourell et al. |
| 5,013,360 A | 5/1991 | Finkelstein et al. |
| 5,017,753 A | 5/1991 | Deckard |
| 5,086,334 A | 2/1992 | Eberlein |
| 5,089,445 A | 2/1992 | Francis |
| 5,089,446 A | 2/1992 | Cornelius et al. |
| 5,117,279 A | 5/1992 | Karpman |
| 5,132,143 A | 7/1992 | Deckard |
| 5,155,321 A | 10/1992 | Grube et al. |
| 5,155,324 A | 10/1992 | Deckard et al. |
| 5,156,697 A | 10/1992 | Bourell et al. |
| 5,173,220 A | 12/1992 | Reiff et al. |
| 5,182,170 A | 1/1993 | Marcus et al. |
| 5,252,264 A | 10/1993 | Forderhase et al. |
| 5,264,061 A | 11/1993 | Juskey et al. |
| 5,278,442 A | 1/1994 | Prinz et al. |
| 5,284,695 A | 2/1994 | Barlow et al. |

(List continued on next page.)

Primary Examiner—Albert W. Paladini
Assistant Examiner—David A. Zarneke
(74) Attorney, Agent, or Firm—TraskBritt

(57) ABSTRACT

A stereolithographically fabricated, substantially hermetic package surrounds at least a portion of a semiconductor die so as to substantially hermetically seal the same. Stereolithographic processes may be used to fabricate at least a portion of the substantially hermetic package from thermoplastic glass, other types of glass, ceramics, or metals. The substantially hermetic package may be used with semiconductor device assemblies or with bare or minimally packaged semiconductor dice, including dice that have yet to be singulated from a wafer. The stereolithographic method may include use of a machine vision system including at least one camera operably associated with a computer controlling a stereolithographic application of material so that the system may recognize the position, orientation, and features of a semiconductor device assembly, semiconductor die, or other substrate on which the substantially hermetic package is to be fabricated.

26 Claims, 9 Drawing Sheets

U.S. PATENT DOCUMENTS

| | | |
|---|---|---|
| 5,304,329 A | 4/1994 | Dickens, Jr. et al. |
| 5,316,580 A | 5/1994 | Deckard |
| 5,332,051 A | 7/1994 | Knowlton |
| 5,340,656 A | 8/1994 | Sachs et al. |
| 5,342,919 A | 8/1994 | Dickens, Jr. et al. |
| 5,352,405 A | 10/1994 | Beaman et al. |
| 5,385,780 A | 1/1995 | Lee |
| 5,387,380 A | 2/1995 | Cima et al. |
| 5,484,314 A | 1/1996 | Farnworth |
| 5,490,882 A | 2/1996 | Sachs et al. |
| 5,490,962 A | 2/1996 | Cima et al. |
| 5,518,680 A | 5/1996 | Cima et al. |
| 5,527,877 A | 6/1996 | Dickens, Jr. et al. |
| 5,648,450 A | 7/1997 | Dickens, Jr. et al. |
| 5,660,621 A | 8/1997 | Bredt |
| 5,673,258 A | 9/1997 | Helbig et al. |
| 5,682,065 A | 10/1997 | Farnworth et al. |
| 5,684,713 A | 11/1997 | Asada et al. |
| 5,705,117 A | 1/1998 | O'Connor et al. |
| 5,733,497 A | 3/1998 | McAlea et al. |
| 5,749,041 A | 5/1998 | Lakshiminarayan et al. |
| 5,775,402 A | 7/1998 | Sachs et al. |
| 5,807,437 A | 9/1998 | Sachs et al. |
| 5,814,161 A | 9/1998 | Sachs et al. |
| 5,817,206 A | 10/1998 | McAlea et al. |
| 5,851,465 A | 12/1998 | Bredt |
| 5,855,836 A | 1/1999 | Leyden et al. |
| 5,869,170 A | 2/1999 | Cima et al. |
| 5,877,093 A | 3/1999 | Heffner et al. |
| 5,903,044 A | 5/1999 | Farnworth et al. |
| 5,958,100 A | 9/1999 | Farnworth et al. |
| 6,046,507 A | 4/2000 | Hatchard et al. |

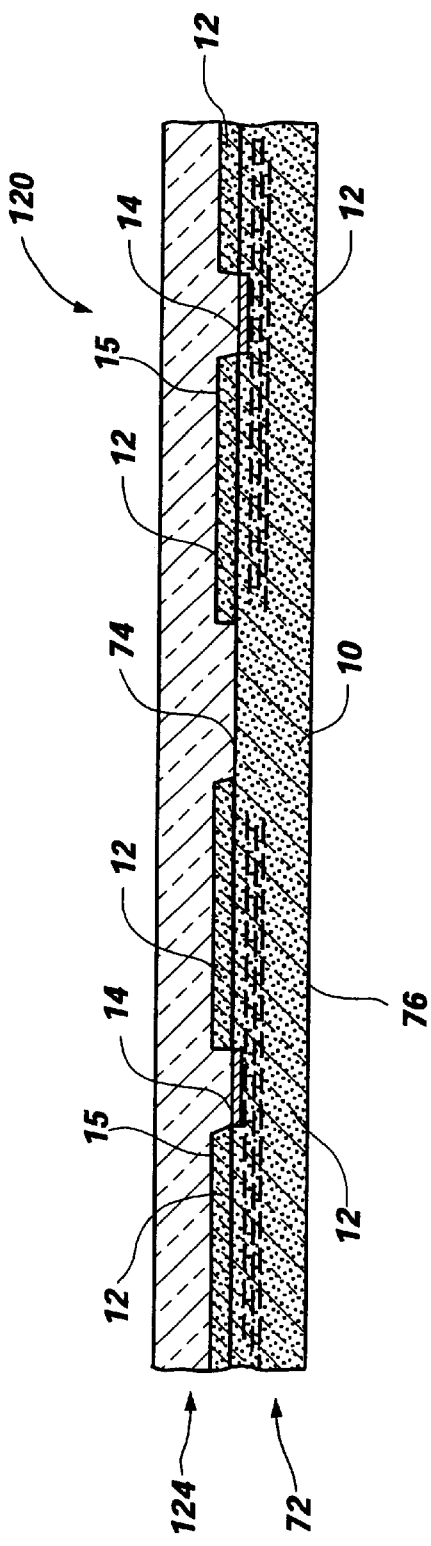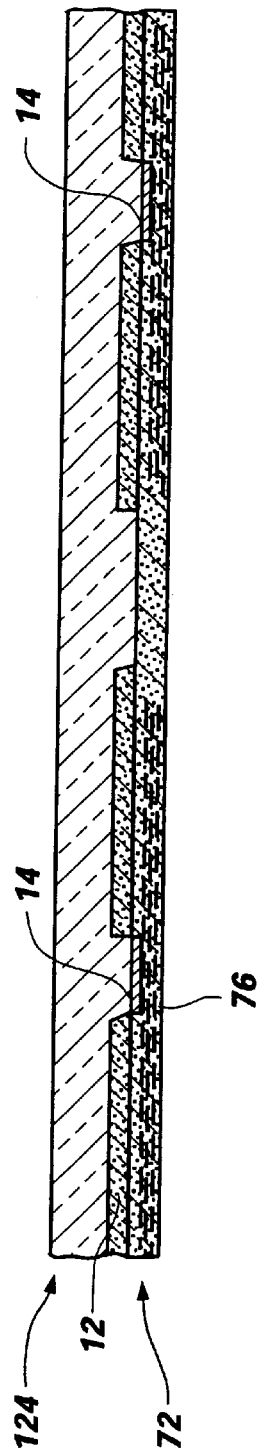

STEREOLITHOGRAPHIC METHODS FOR FABRICATING HERMETIC SEMICONDUCTOR DEVICE PACKAGES AND SEMICONDUCTOR DEVICES INCLUDING STEREOLITHOGRAPHICALLY FABRICATED HERMETIC PACKAGES

CROSS-REFERENCE TO RELATED APPLICATION

This application is a divisional of application Ser. No. 09/640,801, filed Aug. 17, 2000, now U.S. Pat. No. 6,432,752.

BACKGROUND OF THE INVENTION

1. Field of the Invention

The present invention relates to hermetically packaged semiconductor devices and, more particularly, to semiconductor devices including stereolithographically fabricated hermetic packages. The present invention also relates to the use of stereolithography to fabricate hermetic packages on semiconductor device assemblies or on semiconductor dice.

SEMICONDUCTOR DEVICE PACKAGES

2. Background of Related Art

Solid-state electronic devices, such as semiconductor dice, which are also referred to as semiconductor devices, are typically manufactured on substrates of semiconductor material, such as silicon, germanium, gallium arsenide, or indium phosphide. Circuitry is formed on one surface of a substrate with input and output pads being formed on an active surface of the semiconductor dice of the substrate to facilitate electrical connection with other electronic devices.

Semiconductor devices are often packaged to protect the semiconductor dice from mechanical damage, external contamination, and moisture. Typical types of semiconductor device packages include plastic encapsulated packages, quasi-hermetic cavity type packages, and fully hermetic cavity type packages.

When plastic packages are used, the plastic of the package contacts metal elements of the semiconductor device. Typically, these plastic-metal interfaces do not seal sufficiently to prevent exposure of the die to moisture or to soluble ions. When brought into contact with a semiconductor die, these soluble ions act as electrolytes and, thus, cause corrosive failure of the semiconductor die. In addition, the extensive use of precious metals coupled with base metals in semiconductor dice provides direct current (dc) galvanic potentials for electrochemical corrosion reactions and dendrite growth, thereby affecting the performance and life of the encapsulated semiconductor chip. Thus, while plastic encapsulation of semiconductor devices is the most common form of packaging, semiconductor dice in plastic packages are still vulnerable to electrochemical processes.

As a result of the problems associated with the plastic encapsulation of semiconductor devices, it is sometimes desirable to hermetically package semiconductor dice to prevent external moisture and chemicals from contacting the same. Hermetic packages for semiconductor chips are generally formed from metal or ceramic material. Typically, conventional hermetic packages include a lid or a cap to seal a semiconductor device mounted on a suitable substrate. When a semiconductor device includes a die connected to a lead frame, the leads of the lead frame also need to be hermetically sealed. In metal packages, the individual leads are sealed into the metal platform by separated glass seals. In ceramic packages, the leads extend through the ceramic and are sealed thereby.

Several types of ceramic packages are used to hermetically seal semiconductor chips. Exemplary ceramic hermetic packages include ceramic dual-in-line packages, hard glass packages, side-brazed dual-in-line packages, bottom-brazed or top-brazed chip carriers, pin-grid arrays, or other multilayer ceramic packages. Some of these types of packages are described in U.S. Pat. Nos. 4,769,345, 4,821,151, 4,866,571, 4,967,260, 5,014,159, and 5,323,051. Typically, these packages include a base with a receptacle formed therein to receive a semiconductor device and a lid that is disposable over the receptacle.

In sealing these hermetic packages, the material of one or both of the lid and the base typically must be heated to a temperature that will facilitate sealing of the lid over the receptacle of the base and, thus, hermetic sealing of the semiconductor device within the receptacle. These hermetic packages are, however, somewhat undesirable due to the high temperatures (e.g., at least about 400° C. to about 500° C.) and lengthy sealing times (e.g., as much as about one or two hours) that are required to obtain a hermetic seal as the lid of a hermetic package is sealed over the receptacle of the hermetic package. Such high temperatures for prolonged periods of time can cause oxidation of the leads of a semiconductor device or cracking of the passivation layer over the active surface of a semiconductor device, both of which can cause the semiconductor device to fail.

Moreover, as conventional hermetic packages are typically fabricated separately from the semiconductor device assembly disposed therein, conventional hermetic packages are relatively bulky and can occupy undesirably large amounts of the real estate on a carrier substrate to which the packaged semiconductor device is connected. U.S. Pat. Nos. 5,958,100 (hereinafter "the '100 Patent"), which is assigned to the assignee of the present invention, discloses a relatively small, substantially hermetic package that is fabricated on semiconductor dice at the wafer stage. The material of the hermetic package, which is referred to as a thermoplastic glass, is a glass with a lower melting temperature than the glass and ceramic materials typically used as hermetic packages. Nonetheless, the packaged semiconductor devices of the '100 Patent are somewhat bulky. Moreover, despite the lower process temperatures of the materials used to fabricate the hermetic packages of the '100 Patent, packaging temperatures may be as high as about 350° C. As the '100 Patent teaches a method of molding the hermetic package directly onto a semiconductor device assembly by use of known molding equipment, the semiconductor device may be exposed to these molding temperatures for several minutes, until the thermoplastic glass cools.

Less bulky hermetic packages are disclosed in U.S. Pat. Nos. 5,682,065 and 5,903,044, both of which have been assigned to the assignee of the present invention. Each of these patents discloses a method of fully hermetically packaging semiconductor dice at the wafer scale. Thus, the hermetic package disclosed in these patents takes up much less space than that occupied by conventional hermetic packages. The hermetic package of these patents is somewhat undesirable, however, in that the conventional hermetic packaging materials used to form such a package have very high process temperatures (e.g., up to about 600° C.). Thus, the semiconductor dice can be damaged during packaging.

Thus, a hermetic packaging method is needed to fabricate a compact, substantially hermetic package wherein the temperature to which a semiconductor device is exposed during the packaging process is reduced, as is the amount of time the semiconductor device is exposed to the increased temperature.

Stereolithography

In the past decade, a manufacturing technique termed "stereolithography", also known as "layered manufacturing", has evolved to a degree where it is employed in many industries.

Essentially, stereolithography as conventionally practiced involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a partially consolidated, fixed, or semisolid state in those areas of a given layer corresponding to portions of the object, the consolidated or fixed material also at that time being substantially concurrently bonded to a lower layer of the object to be fabricated. The unconsolidated material employed to build an object may be supplied in particulate or liquid form, and the material itself may be consolidated or fixed, or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, surface resolution is highly dependent upon the minimum surface area of the liquid which can be fixed and the minimum thickness of a layer that can be generated. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design was committed to large-scale production.

In more recent years, stereolithography has been employed to develop and refine object designs in relatively inexpensive materials and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques. It has also been recognized in some industries that a stereolithographic object or component may be formed or built around another, pre-existing object or component to create a larger product.

However, to the inventor's knowledge, stereolithography has yet to be applied to mass production of articles in volumes of thousands or millions, or employed to produce, augment or enhance products including other, pre-existing components in large quantities, where minute component sizes are involved, and where extremely high resolution and a high degree of reproducibility of results is required. In particular, the inventor is not aware of the use of stereolithography to fabricate substantially hermetic packages for semiconductor devices. Furthermore, conventional stereolithography apparatus and methods fail to address the difficulties of precisely locating and orienting a number of pre-existing components for stereolithographic application of material thereto without the use of mechanical alignment techniques or to otherwise assure precise, repeatable placement of components.

SUMMARY OF THE INVENTION

According to one aspect, the present invention includes a packaged semiconductor device. A first embodiment of the packaged semiconductor device includes a semiconductor die operably connected to a carrier substrate and a substantially hermetic package formed over the semiconductor die and in contact with the carrier substrate so as to seal the semiconductor die from the external environment. The semiconductor die may be any type of semiconductor die known in the art and may be connected to the carrier substrate by any type of connection known in the art. The substantially hermetic package includes superimposed, contiguous, mutually adhered layers of a suitable hermetic packaging material, such as a thermoplastic glass.

In another embodiment, the hermetically packaged semiconductor device of the present invention includes a semiconductor die operably connected to a lead frame, the die and portions of the lead frame adjacent thereto being sealed in a substantially hermetic package. Again, the semiconductor die and the lead frame may be of any type known in the art, and the semiconductor die may be connected to the lead frame by any known, suitable method. The substantially hermetic package has a plurality of superimposed, contiguous, mutually adhered layers of a suitable hermetic packaging material, such as a thermoplastic glass.

In yet another embodiment of the packaged semiconductor device of the present invention, a semiconductor die is substantially hermetically packaged at the wafer scale. The hermetic package includes external circuits that communicate with the bond pads of the semiconductor die so as to facilitate connection of the packaged semiconductor device to a higher level substrate or to a lead frame.

Another aspect of the present invention includes the stereolithographic fabrication of a hermetic package over a semiconductor die that is operably connected to a carrier substrate, a lead frame, or another higher level connection element. Preferably, the hermetic package is fabricated by forming layers of unconsolidated hermetic material adjacent to or around the assembly and by consolidating the hermetic material in selected regions adjacent to the semiconductor die or the connection element. Preferably, selective laser sintering (SLS) techniques are employed to fabricate the hermetic package from layers of particulate or powdered hermetic packaging material.

As it is important that packages of the present invention protect the semiconductor dice therein from moisture, accompanying ions, and other potentially damaging factors from the environment external to the semiconductor dice, the substantially hermetic packages of the present invention are preferably manufactured from materials that will adhere and seal to the materials of the semiconductor device so as to prevent potentially damaging factors from contacting same. Accordingly, the stereolithography processes that are preferred for fabricating the substantially hermetic packages of the present invention are capable of fabricating structures from materials that have good hermetic qualities when used with semiconductor devices.

In one such stereolithography process, known as "selective laser sintering" or "SLS", structures are fabricated from layers of powdered or particulate material. The particles in selected regions of each of the layers can be bonded together by use of a laser under the control of a computer. The laser either heats the material particles and sinters adjacent particles together, heats a binder material mixed in with the particles to bond the particles, or heats a binder material with which the material particles are coated to secure adjacent particles in the selected regions of a layer to one another.

Another exemplary stereolithography process that may be used to fabricate substantially hermetic packages incorporating teachings of the present invention is referred to as "laminated object manufacturing" or "LOM". Laminated object manufacturing involves the use of a laser or other cutting device to define the peripheries of a layer of an object from a sheet of material. Adjacent layers of the object are secured to one another to form the object.

The stereolithographic package fabrication method of the present invention preferably includes the use of a machine vision system to locate the semiconductor device assemblies, individual semiconductor dice, or other substrates over which the substantially hermetic packages are to be fabricated, as well as the features or other components on or associated with the semiconductor device assemblies, dice, or substrates (e.g., bond wires, leads, etc.). The use of a machine vision system directs the alignment of a stereolithography system with each semiconductor device assembly, die, or substrate for material disposition purposes. Accordingly, the semiconductor device assemblies, dice, or other substrates need not be precisely mechanically aligned with any component of the stereolithography system to practice the stereolithographic embodiment of the method of the present invention.

In a preferred embodiment, the substantially hermetic package to be fabricated upon a semiconductor device assembly, die, or other substrate in accordance with the invention is fabricated using precisely focused electromagnetic radiation in the form of a laser under control of a computer and responsive to input from a machine vision system, such as a pattern recognition system, to define each layer of the object to be formed from a layer of material disposed on the semiconductor device assembly, die, or substrate.

Other features and advantages of the present invention will become apparent to those of skill in the art through a consideration of the ensuing description, the accompanying drawings, and the appended claims.

BRIEF DESCRIPTION OF THE DRAWINGS

FIG. 9 is a schematic, partial cross-sectional representation of the wafer of FIG. 8, illustrating the application of a first portion of hermetic packages over a surface of the wafer;

FIG. 10 is a schematic, partial cross-sectional representation of the wafer of FIG. 9, illustrating thinning of the wafer;

DETAILED DESCRIPTION OF THE INVENTION

Figure 1:
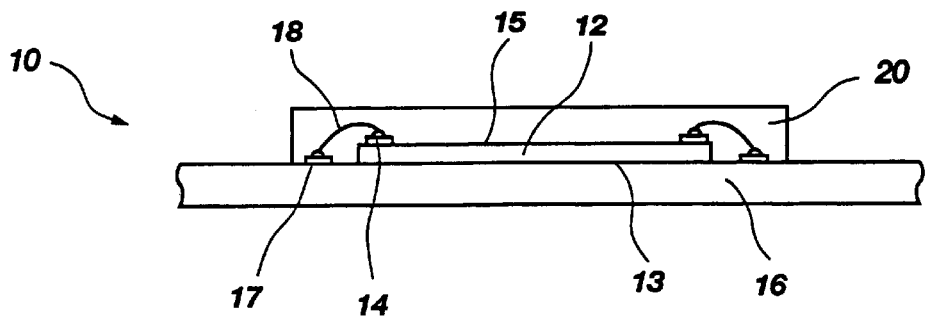
FIG. 1 is a schematic cross-sectional representation of a semiconductor device assembly including a semiconductor die wire bonded to a carrier substrate, the semiconductor device assembly being substantially hermetically packaged according to the method of the present invention.

Referring to FIG. 1, an embodiment of a substantially hermetically packaged semiconductor device 10 is illustrated. Semiconductor device 10 includes a semiconductor die 12 electrically connected to a higher level carrier substrate 16. As illustrated, a backside 13 of semiconductor die 12 is secured to carrier substrate 16, with bond pads 14 on an active surface 15 of semiconductor die 12 being connected to corresponding terminals 17 of carrier substrate 16 by way of wire bonds 18.

Semiconductor device 10 also includes a substantially hermetic package 20 that completely covers semiconductor die 12, wire bonds 18, and terminals 17 and substantially seals each of these elements to protect same from the environment external to semiconductor device 10. As illustrated, hermetic package 20 extends over the surface of carrier substrate 16 just beyond terminals 17. Accordingly, hermetic package 20 consumes a minimal amount of real estate on carrier substrate 16 and is therefor relatively compact.

Hermetic package 20 is preferably formed from a suitable hermetic packaging material, such as a metal, ceramic, or glass. Exemplary types of glass that are most preferred for fabricating hermetic package 20 are thermoplastic glasses, such as those disclosed in U.S. Pat. No. 5,089,445 (hereinafter "the '445 Patent"), issued to Gaylord L. Francis on Feb. 18, 1992, and in U.S. Pat. No. 5,089,446 (hereinafter "the '446 Patent"), issued to Lauren K. Cornelius et al. on Feb. 18, 1992, the disclosures of both of which are hereby incorporated by this reference. The '445 and '446 Patents disclose tin-phosphorus oxyfluoride and lead sealing glasses, respectively. These glasses have sealing temperatures of below about 350° C. and coefficients of thermal expansion (CTEs) of below about $110 \times 10^7 /°$ C.

Figure 2:
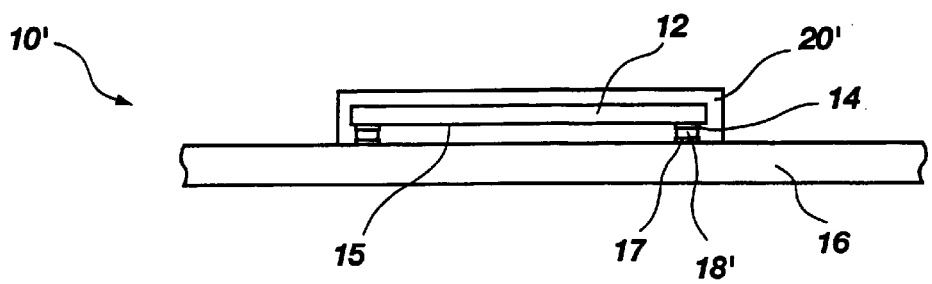
FIG. 2 is a schematic cross-sectional representation of a semiconductor device assembly including a semiconductor die flip-chip bonded to a carrier substrate, the semiconductor device assembly being substantially hermetically packaged according to the method of the present invention.

FIG. 2 illustrates another embodiment of a semiconductor device 10' according to the present invention. Semiconductor device 10' includes a semiconductor die 12 flip-chip bonded to a higher level carrier substrate 16. Accordingly, bond pads 14 of semiconductor die 12 are connected to terminals 17 of carrier substrate 16 by way of solder balls 18' or other similar conductive structures. Semiconductor die 12, solder balls 18', and terminals 17 are substantially hermetically sealed within a hermetic package 20'. As illustrated, hermetic packaging material may fill the space between active surface 15 of semiconductor die 12 and carrier substrate 16. Alternatively, this space may be filled with an underfill material prior to packaging or the space may remain open.

As shown in FIG. 2, the amount of real estate on carrier substrate 16 that is occupied by hermetic package 20' is only slightly larger than the amount of real estate occupied by semiconductor die 12. Accordingly, hermetic package 20' is relatively compact.

Figure 3:
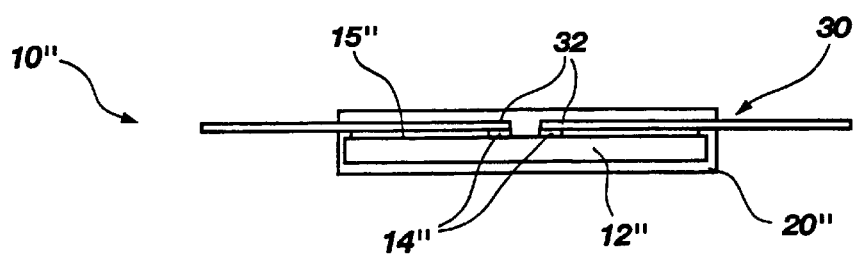
FIG. 3 is a schematic cross-sectional representation of a semiconductor device assembly including a semiconductor die and a leads-over-chip (LOC) type lead frame connected thereto, the semiconductor device assembly being substantially hermetically packaged according to the method of the present invention.

Referring now to FIG. 3, another embodiment of a packaged semiconductor device 10" according to the present invention includes a leads-over-chip (LOC) type semiconductor die 12" and a correspondingly configured lead frame 30. Bond pads 14" of semiconductor die 12" are electrically connected to corresponding leads 32 of lead frame 30 as known in the art, such as by wire bonds or tape automated bonding (TAB).

The hermetic package 20" of semiconductor device 10" substantially hermetically encapsulates semiconductor die 12" in its entirety, as well as the portions of leads 32 that traverse active surface 15" of semiconductor die 12". Accordingly, packaged semiconductor device 10" may have a relatively small hermetic package 20".

Figure 4:
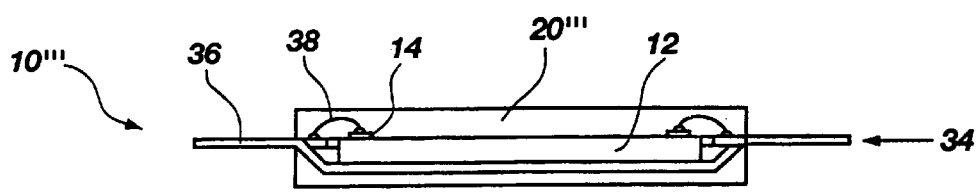
FIG. 4 is a schematic cross-sectional representation of a semiconductor device assembly including a semiconductor die wire bonded to a conventional lead frame, the semiconductor device assembly being substantially hermetically packaged according to the method of the present invention.
Figure 1A:
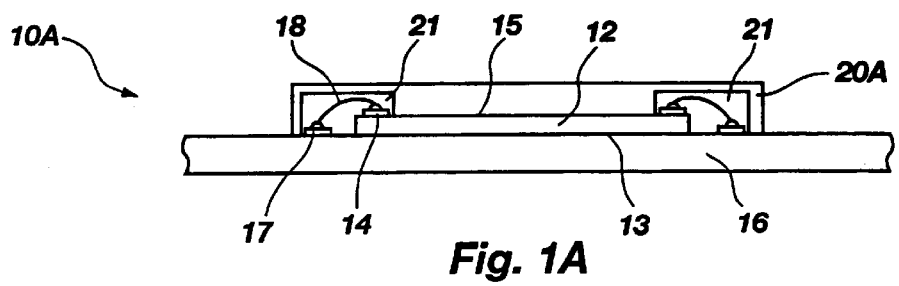
FIG. 1A, 2A, 3A, 4A, and 5A are schematic representations of exemplary hermetically package devices such as those illustrated in FIGS. 1, 2, 3, 4, and 5, respectively, wherein a metal is used as the hermetic packaging material and conductive structures of the packaged semiconductor device are electrically isolated from the metal hermetic packaging material.
Figure 2A:
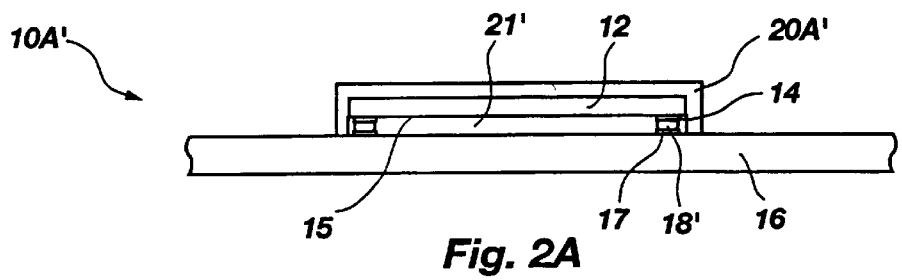
Figure 3A:
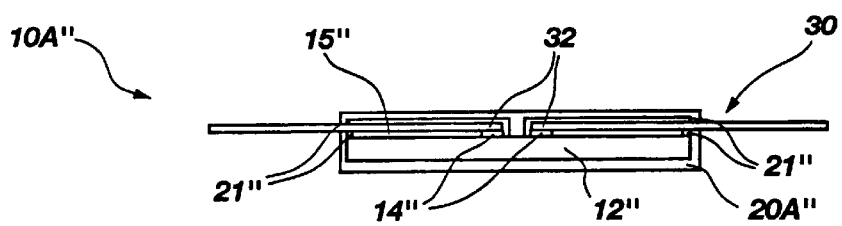
Figure 4A:
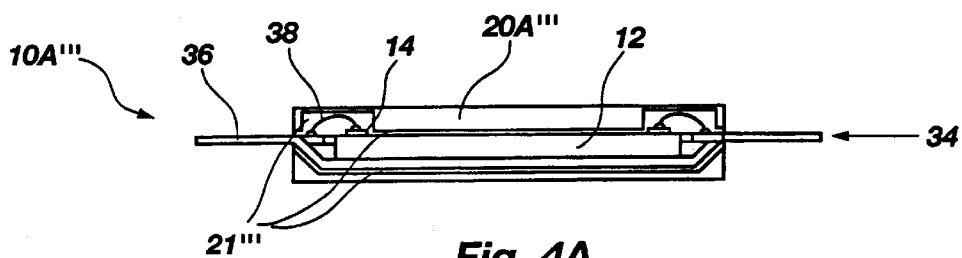

Yet another embodiment of a substantially hermetically packaged semiconductor device 10'" incorporating teachings of the present invention is depicted in FIG. 4. Semiconductor device 10'" includes a semiconductor die 12, the bond pads 14 of which are operably connected to leads 36 of a conventional (i.e., die paddle type) lead frame 34 by wire bonds 38. A hermetic package 20'" is disposed over semiconductor die 12 and wire bonds 38, as well as over portions of lead frame 34 adjacent semiconductor die 12, including the portions of leads 36 proximate wire bonds 38.

Figure 5A:
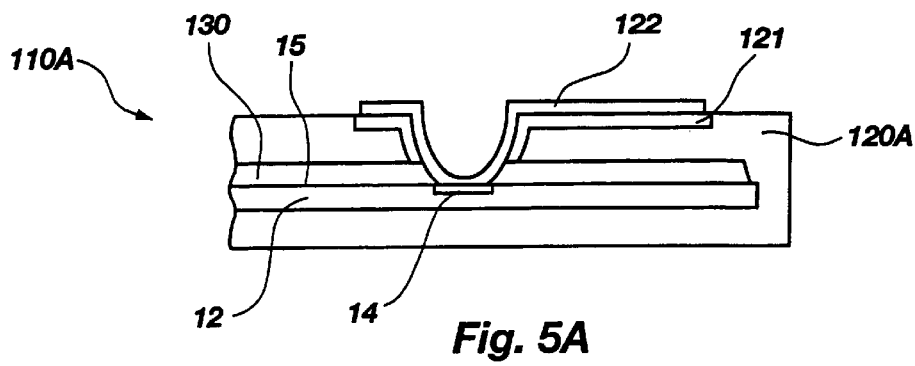
Figure 5:
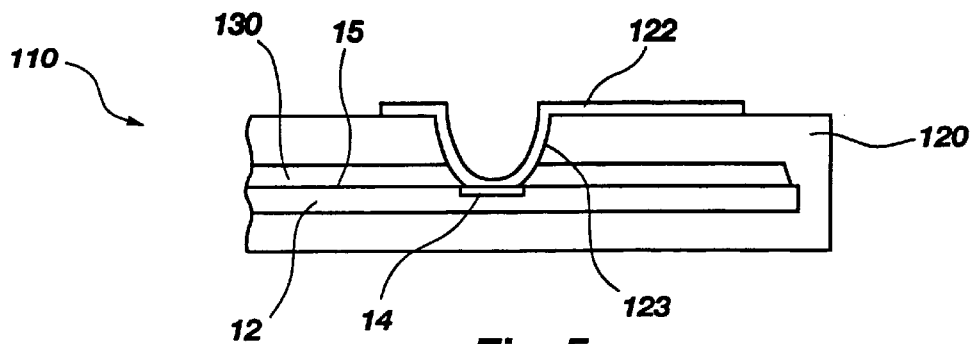
FIG. 5 is a schematic, partial cross-sectional representation of a substantially hermetically packaged semiconductor die according to the present invention.

FIG. 5 depicts another embodiment of a substantially hermetically packaged semiconductor device 110 that includes only a semiconductor die 12 and a substantially hermetic package 120. Semiconductor die 12 includes a passivation layer 130 on active surface 15 thereof to provide protection for the active circuitry of semiconductor die 12, as is known in the art. While such a passivation layer 130 provides some sealing effect, it does not provide a substantially hermetical seal over semiconductor die 12.

Figure 6:
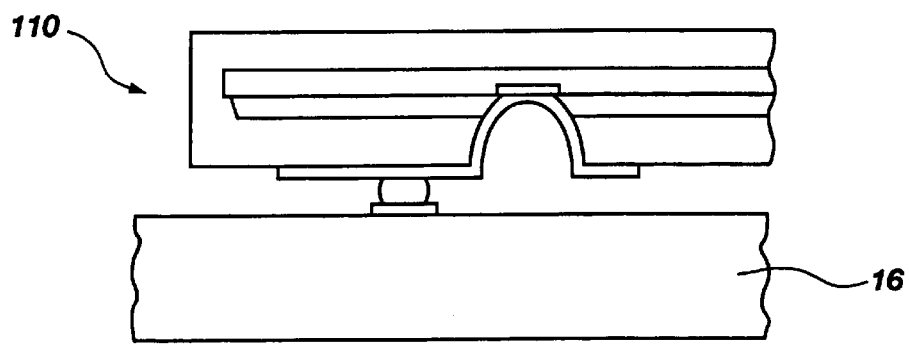
FIG. 6 is a schematic, partial cross-sectional representation depicting flip-chip bonding of the packaged semiconductor die of FIG. 5 to a higher level substrate.
Figure 7:
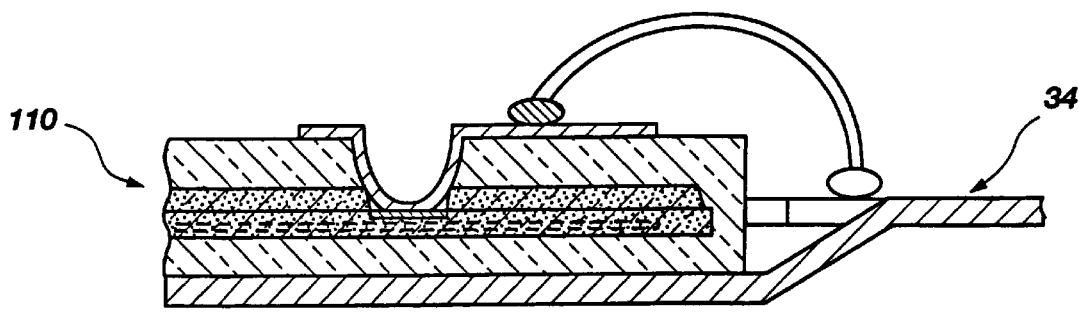
FIG. 7 is a schematic, partial cross-sectional representation depicting the wire bond connection of packaged semiconductor die of FIG. 5 to a conventional lead frame.

Hermetic package 120 has one or more circuit traces 122 on a surface thereof, each circuit trace 122 communicating with a bond pad 14 of semiconductor die 12 through a cavity or via 123 extending through the packaging material so as to facilitate the connection of semiconductor die 12 to external components. For example, semiconductor device 110 can be operably connected to external components by way of a carrier substrate 16, as shown in FIG. 6, to which semiconductor device 110 is either flip-chip bonded or connected by way of wire bonds or other known connective elements. Alternatively, semiconductor device 110 can be operably connected to external components by way of a lead frame 34, as illustrated in FIG. 7.

Turning to FIGS. 1A, 2A, 3A, 4A, and 5A, the illustrated hermetically packaged semiconductor devices 10A, 10A', 10A", 10A'", and 110A, respectively, are substantially the same as the hermetically packaged semiconductor device structures illustrated in FIGS. 1, 2, 3, 4, and 5, respectively. Hermetic packages 20A, 20A', 20A", 20A'", and 120A are, however, formed from a metal. In addition, hermetically packaged semiconductor devices 10A, 10A', 10A", 10A'", and 101A each include electrically insulative coatings, or layers, 21, 21', 21 ", 21'", and 121, respectively, formed over at least the electrically conductive structures of semiconductor devices 12, 12" so as to insulate the electrically conductive structures from the metal of hermetic packages 20A, 20A', 20A", 20A'", and 120A. These electrically insulative coatings 21, 21', 21", 21'", and 121 may also be formed from a hermetic packaging material in accordance with teachings of the present invention, or from a suitable material by other, known methods.

Referring now to FIGS. 8–14, a method for forming a hermetic package 120 on one or more semiconductor dice 12 is illustrated.

Figure 8:
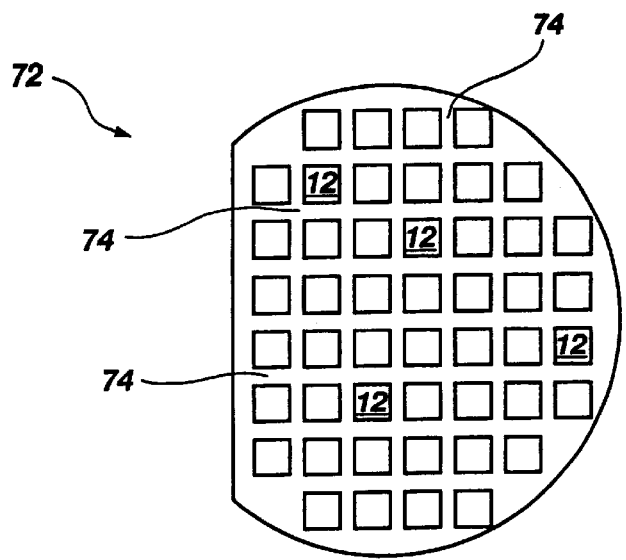
FIG. 8 is a schematic representation of a semiconductor wafer with a plurality of semiconductor dice.

FIG. 8 illustrates a wafer 72 with a plurality of semiconductor dice 12 thereon. As shown, semiconductor dice 12 have not been separated, but remain physically connected to one another as part of wafer 72. When in wafer form, semiconductor dice 12 are electrically isolated from one another by way of streets 74 scribed between adjacent semiconductor dice 12.

As shown in FIG. 9, the side of wafer 72 on which active surfaces 15 of semiconductor dice 12 are located is coated with a layer of hermetic packaging material to form a first portion 124 of hermetic package 120. First portion 124 has a substantially planar surface and a sufficient thickness to entirely cover active surfaces 15 and streets 74 located between adjacent semiconductor dice 12. Preferably, the hermetic packaging material of first portion 124 can be etched so as to facilitate the subsequent exposure of bond pads 14 therethrough. First portion 124 may be formed by the stereolithography process described hereinafter. Alternatively, first portion 124 may be formed by any other suitable, known technique, such as spin coating, dip coating, or flow coating.

While FIG. 9 illustrates the formation of first portion 124 on the side of wafer 72 on which active surfaces 15 of semiconductor dice 12 are located, first portion 124 may also be formed on backside 76 of wafer 72.

Turning now to FIG. 10, the thickness of wafer 72 may be optionally reduced by removing material thereof from backside 76 thereof by any suitable, known method, such as by mechanical abrasion or chemical mechanical planarization (CMP) (e.g., chemical mechanical polishing). Reducing the thickness of wafer 72 may also improve the planarity of backside 76 thereof. If first portion 124 of hermetic package 120 (see FIG. 5) is applied to backside 76 of wafer 72, such a thinning process may be effected prior to applying first portion 124 to backside 76.

Figure 11:
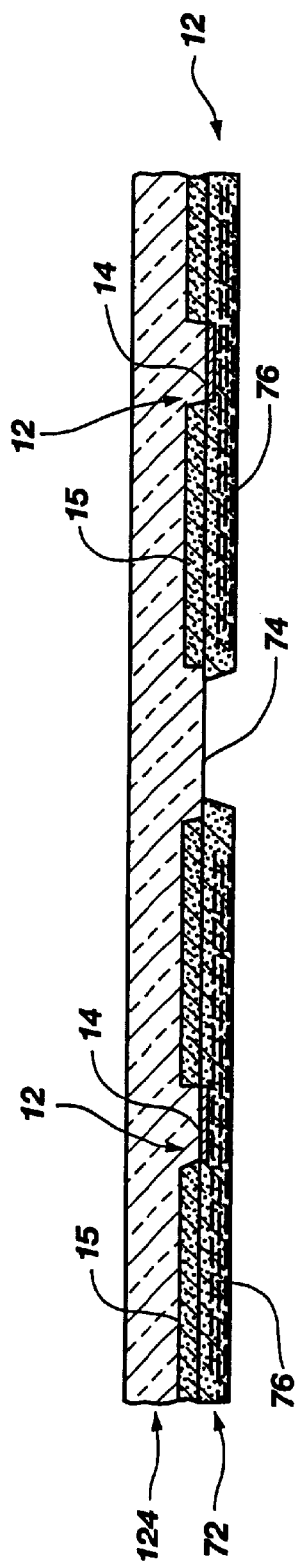
FIG. 11 is a schematic, partial cross-sectional representation of the wafer of FIG. 10, illustrating the removal of material located in streets between adjacent semiconductor dice of the wafer.

With reference to FIG. 11, a layer of a suitable resist material (not shown) may be applied, as known in the art, to the opposite side of wafer 72 from that upon which first portion 124 of hermetic package 120 (see FIG. 5) is disposed. When the layer of resist material is applied to backside 76 of wafer 72, the layer of resist material is patterned so as to form a photomask through which regions of backside 76 that are located directly beneath streets 74 are exposed. When the layer of resist material is applied over active surfaces 15 of semiconductor dice 12, the layer of resist material is patterned so that streets 74 are exposed therethrough. The regions of wafer 72 that are exposed through the resist material are then etched with a suitable etchant to remove the material of streets 74. The orientations and positions of semiconductor die 12 relative to one another are maintained, however, by first portion 124. The photomask may then be removed from wafer 72 by known processes.

As an alternative to the use of a photomask, a hard mask, such as a silicon oxide or silicon nitride hard mask, may be formed on either backside 76 of wafer 72 or over active surfaces 15 of semiconductor dice 12. Streets 74 may then be etched through, as known in the art. Such a hard mask need not be removed from wafer 72.

Figure 12:
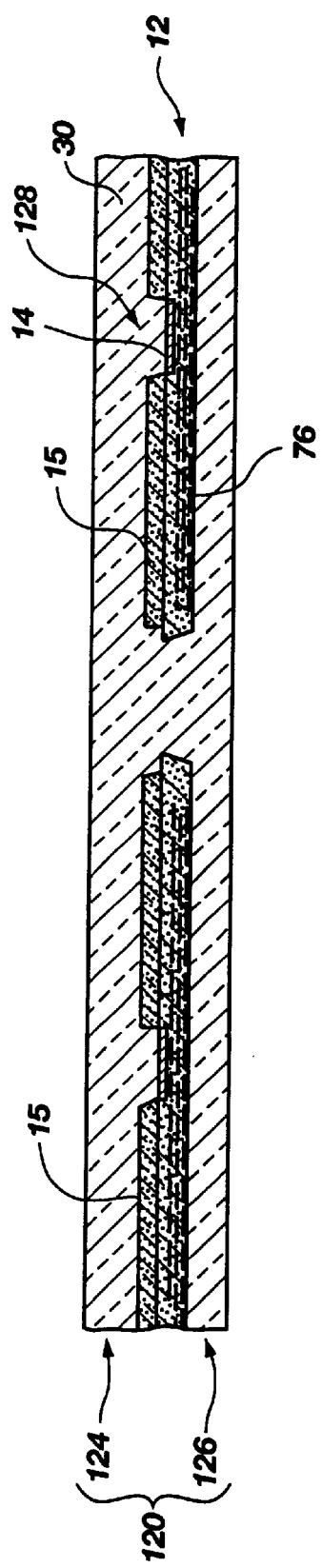
FIG. 12 is a schematic, partial cross-sectional representation of the wafer of FIG. 11, illustrating the application of a second portion of the hermetic packages over the exposed surface of the semiconductor dice and between adjacent semiconductor dice.

As another alternative, the material of wafer 72 located under and in vertical alignment with streets 74 may be removed by other known processes, such as by the use of wafer saws, so long as the orientations and lateral positions of semiconductor dice 12 are maintained by first portion 124 of hermetic package 120. Once the semiconductor material lying between adjacent semiconductor dice 12 has been removed, wafer 72 is inverted and hermetic packaging material is applied to the other side of semiconductor dice 12 and between adjacent semiconductor dice 12, as shown in FIG. 12, to form a second portion 126 of hermetic package 120. As illustrated, second portion 126 is applied to backsides 76 of semiconductor dice 12.

Figure 13:
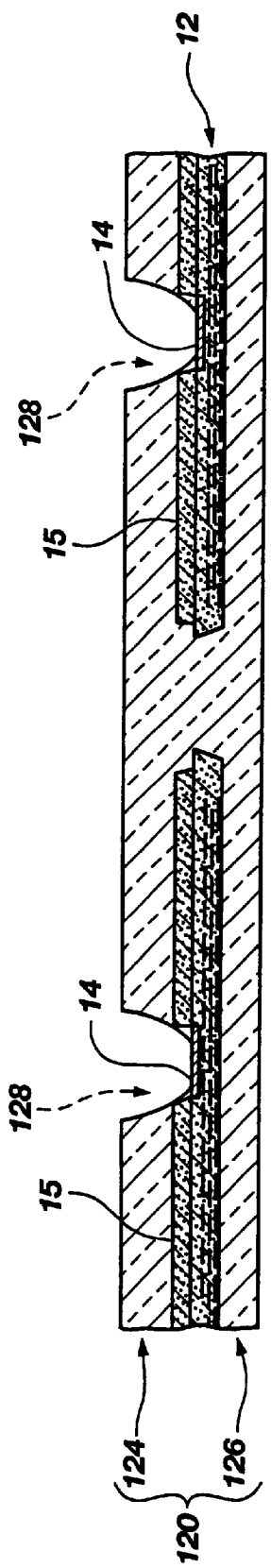
FIG. 13 is a schematic, partial cross-sectional representation of the wafer of FIG. 12, illustrating exposure of bond pads of the semiconductor dice through the hermetic packages.

Referring now to FIG. 13, a mask (not shown), such as a photomask or hard mask, is disposed on hermetic package 120 over active surfaces 15 of semiconductor dice 12 so that regions 128 of hermetic package 120 located over bond pads 14 are exposed therethrough. These regions 128 are then removed by known processes, such as by use of a suitable, known etchant, such as hydrofluoric acid in wet etch processes or a suitable fluorocarbon in dry etch processes, thereby exposing bond pads 14 through hermetic package 120. The mask may thereafter be removed from hermetic package 120 by known processes.

Figure 14:
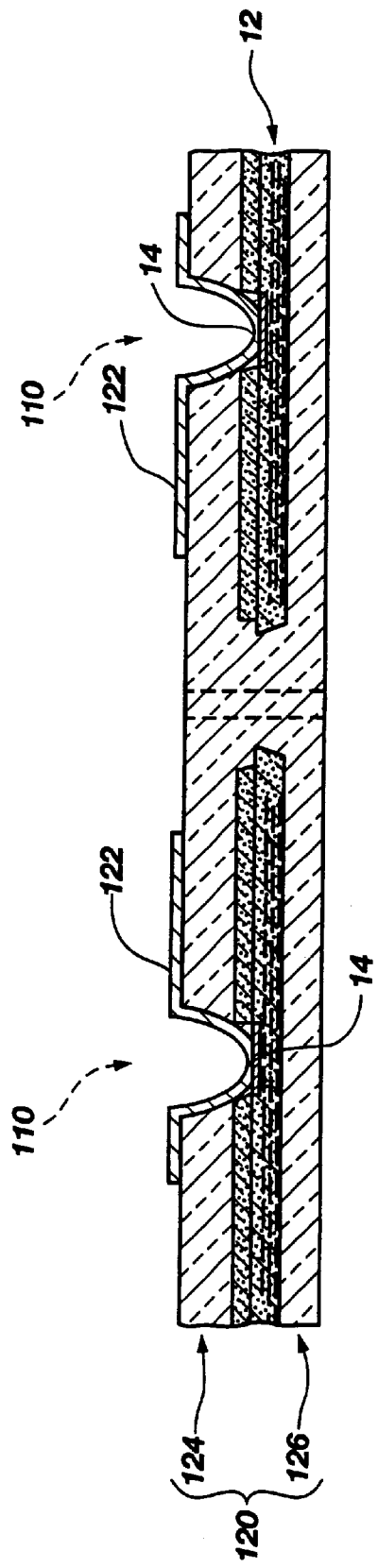
FIG. 14 is a schematic, partial cross-sectional representation of the wafer of FIG. 13, illustrating the fabrication of conductive traces on the hermetic packages and in contact with the exposed bond pads.

As shown in FIG. 14, an electrically conductive layer (e.g., of metal) is formed on hermetic packages 120 and in contact with bond pads 14 so as to again substantially hermetically seal semiconductor dice 12 within their respective hermetic packages 120. The electrically conductive layer is then patterned, as known in the art (e.g., by mask and etch techniques) to form conductive circuit traces 122 without disrupting the hermetic seals provided by hermetic package 120. Each circuit trace 122 communicates with a corresponding bond pad 14 to facilitate connection thereof with a circuit external to semiconductor device 110.

Semiconductor devices 110 may be disconnected from one another by removing hermetic packaging material located between adjacent semiconductor devices 110 without disrupting the substantially hermetic seal provided by hermetic package 120. Such disconnection of semiconductor devices may be effected by use of a wafer saw, mask and etch processes, or otherwise, as known in the art. Each resulting semiconductor device 110 includes a semiconductor die 12 that is substantially fully hermetically sealed on the top, bottom, and all edges thereof by hermetic package 120 and circuit traces 122 thereof, thereby leaving no portion of semiconductor die 12 exposed to an environmental attack.

Methods of Fabricating Substantially Hermetic Packages

In another aspect, the present invention includes methods of fabricating hermetic packages according to the present invention, such as those illustrated in and described with reference to FIGS. 1–5.

While the hermetic package fabrication process of the present invention is preferably performed substantially simultaneously on several semiconductor dice 12 or other substrates, such as prior to singulating semiconductor dice 12 from wafer 72 or on a collection of individual semiconductor devices or other substrates, such as partial wafers, individual semiconductor devices or other substrates can also be provided with hermetic packages in accordance with teachings of the present invention. As another alternative, the method of the present invention can be used to substantially simultaneously fabricate hermetic packages 20 on a collection of different types of semiconductor devices or other substrates.

The hermetic packages of the present invention are preferably fabricated from a material with good sealing or hermetic properties when applied to a semiconductor die, lead frame, or substrate. Exemplary materials that may be used in the packages of the present invention include, without limitation, ceramics, metals, and glasses, such as thermoplastic glasses. Of course, if metals are used to form the hermetic packages of the present invention, electrically conductive structures of the packaged semiconductor device should be electrically isolated from the hermetic packaging material to prevent electrical shorting and failure of the semiconductor device. For example, a thin layer of a suitable insulative material, such as glass or ceramic, may be formed over regions of electrically conductive structures of the semiconductor device that will be covered with the hermetic packaging material, as described above with reference to FIGS. 1A, 2A, 3A, 4A, and 5A, respectively. These thin insulative layers 21, 21', 21", 21'", and 121 may be formed in accordance with methods of the present invention or otherwise, as known in the art. Preferably, the thin insulative layers 21, 21', 21", 21'", and 121 that are used when a hermetic package is formed from a metal also provide hermetic protection the adjacent regions of the semiconductor device, while the metal hermetic package provides both hermetic protection and robustness.

By way of example and not to limit the scope of the present invention, the hermetic packages can be manufactured from thermally conductive materials in powdered or particulate form or in the form of thin sheets.

For simplicity, the ensuing description is limited to an explanation of a method of stereolithographically fabricating hermetic packages 20 directly on semiconductor dice 12. As should be appreciated by those of skill in the art, however, the method described herein is also useful for fabricating hermetic packages separately from a semiconductor device or other substrate, as well as for disposing hermetic packages on packaged semiconductor devices or semiconductor devices having one or more layers of protective material on the backsides thereof. However, the effectiveness of heat transfer from a packaged or coated device will naturally be somewhat compromised unless the coating material is thermally conductive or enhanced with thermally conductive materials.

Stereolithography Apparatus and Methods

Figure 15:
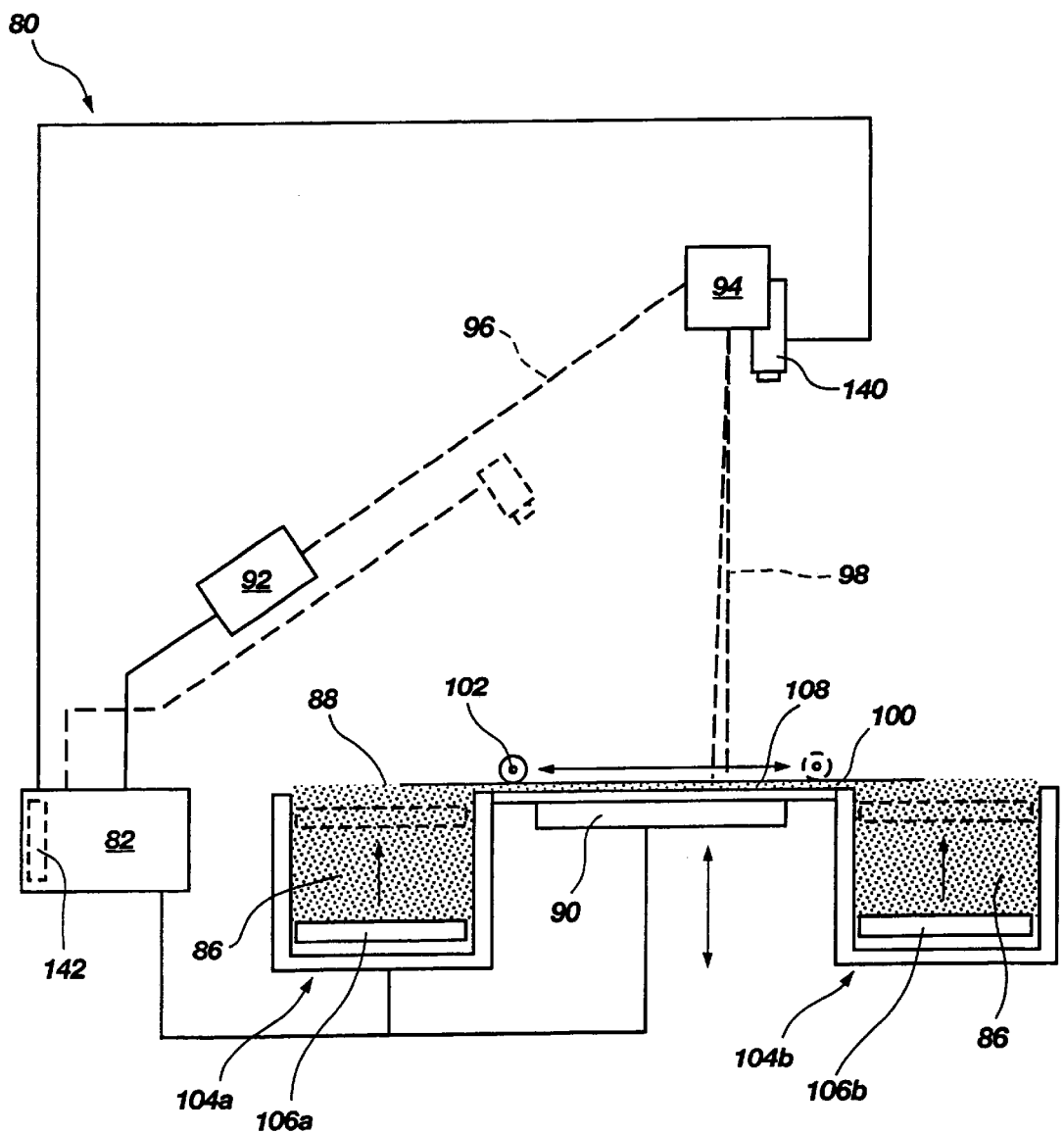
FIG. 15 is schematic representation of an exemplary stereolithography apparatus, a selective laser sintering apparatus, that can be employed in the method of the present invention to fabricate hermetic packages on semiconductor devices or other substrates in accordance with the method of the present invention.

FIG. 15 schematically depicts various components, and operation, of an exemplary stereolithography apparatus 80 to facilitate the reader's understanding of the technology employed in implementation of the method of the present invention, although those of ordinary skill in the art will understand and appreciate that apparatus of other designs and manufacture may be employed in practicing the method of the present invention. Preferred, basic stereolithography apparatus for implementation of the method of the present invention, as well as operation of such apparatus, are described in great detail in United States Patents assigned to DTM Corporation or to Board of Regents, The University of Texas System, both of Austin, Tex., or to The B.F. Goodrich Company of Akron, Ohio, such patents including, without limitation, U.S. Pat. Nos. 4,863,538; 4,944,817; 5,017,753; 5,132,143; 5,155,321; 5,155,324; 5,156,697; 5,182,170; 5,252,264; 5,284,695; 5,304,329; 5,316,580; 5,332,051; 5,342,919; 5,352,405; 5,385,780; 5,430,666; 5,527,877; 5,648,450; 5,673,258; 5,733,497; 5,749,041; and 5,817,206. The disclosure of each of the foregoing patents is hereby incorporated herein by this reference.

With continued reference to FIG. 15 and as noted above, a 3-D CAD drawing, in the form of a data file, of an object (e.g., hermetic package 20 of FIG. 1) to be fabricated is placed in the memory of a computer 82 controlling the operation of apparatus 80, if computer 82 is not a CAD computer in which the original object design is effected. In other words, an object design may be effected in a first computer in an engineering or research facility and the data files transferred via wide or local area network, tape, disc, CD-ROM, or otherwise as known in the art to computer 82 of apparatus 80 for object fabrication.

The data is preferably formatted in an STL (for STereoLithography) file, STL being a standardized format employed by a majority of manufacturers of stereolithography equipment. Fortunately, the format has been adopted for use in many solid-modeling CAD programs, so translation from another internal geometric database format is often unnecessary. In an STL file, the boundary surfaces of an object are defined as a mesh of interconnected triangles.

Data from the STL files resident in computer 82 is manipulated to build an object, such as a hermetic package 20, illustrated in FIGS. 1–5, one layer at a time. Accordingly, the data mathematically representing one or more objects to be fabricated are divided into subsets, each subset representing a slice or layer of the object. The division of data is effected by mathematically sectioning the 3-D CAD model into at least one layer, a single layer or a "stack" of such layers representing the object. Each slice may be from about 0.003 to about 0.020 inch thick. As mentioned previously, a thinner slice promotes higher resolution by enabling better reproduction of fine vertical surface features of the object or objects to be fabricated.

Apparatus 80 includes a horizontal platform 90 on which an object is to be fabricated or a substrate disposed for fabrication of an object thereon. Platform 90 is preferably vertically movable in fine, repeatable increments responsive to computer 82. Material 86 is disposed in a substantially uniform layer of desired thickness by a particulate spreader that operates under control of computer 82. The particulate spreader includes two cartridges 104a and 104b disposed adjacent platform 90 and a roller 102 or scraper bar or blade that is vertically fixed and horizontally movable across platform 90. As a sufficient quantity of particulate material 86 to form a layer of desired thickness is pushed upward out of each cartridge 104a, 104b by a vertically movable support 106a, 106b, respectively, roller or scraper 102 spreads that quantity of particulate material 86 in a uniform layer of desired thickness (e.g., 0.003 to 0.020 inches) over platform 90, a substrate disposed thereon, or an object being fabricated on platform 90 or a substrate thereon. Supports 106a, 106b of cartridges 104a, 104b are also preferably vertically movable in fine, repeatable increments under control of computer 82.

By way of example and not limitation, and as noted above, the layer thickness of material 86 to be formed, for purposes of the invention, may be on the order of about 0.003 to 0.020 inch, with a high degree of uniformity. It should be noted that different material layers may have different heights, so as to form a structure of a precise, intended total height or to provide different material thicknesses for different portions of the structure.

With continuing reference to FIG. 15, in a selective laser sintering embodiment of the hermetic package fabrication process of the present invention, material 86 preferably comprises particles of one or more materials that are useful in hermetic packaging applications, such as thermoplastic glasses, ceramics, metals, or a mixture of any of the foregoing, which material 86 is deposited by cartridges 104a, 104b and roller or scraper 102 over platform 90 with the latter in its uppermost position. Alternatively, the particles of hermetic packaging material may be coated with a suitable binder resin for use in hermetic packaging applications or mixed with particles of such a binder resin.

A fixative head, such as a laser 92, an ink jet nozzle, or a metal spray gun, is suspended above platform 90. The type of fixative head employed depends upon the nature of the particulate material 86 employed to fabricate the object, as well as an optional binder employed to consolidate particles of material 86 in selected regions of the layer.

When the fixative head includes a laser 92, apparatus 80 may also include a galvanometer 94 with one or more pivotal mirrors. Before fabrication of a first layer of an object is commenced, the operational parameters for apparatus 80 are set to adjust the size (diameter, if circular) of the laser light beam used to consolidate or fix material 86. In addition, computer 82 automatically checks and, if necessary, adjusts by means known in the art the surface level 88 of material 86 over platform 90 or a substrate upon which an object is to be fabricated to maintain same at an appropriate focal length for laser beam 98. Alternatively, the height of the mirror of galvanometer 94 may be adjusted responsive to a detected surface level 88 to cause the focal point of laser beam 98 to be located precisely at the surface of material 86 at surface level 88 if level 88 is permitted to vary, although this approach is more complex.

The size of the laser beam "spot" impinging on the surface of material 86 to consolidate or fix same may be on the order of 0.001 inch to 0.008 inch. Resolution is preferably ±0.0003 inch in the X-Y plane (parallel to surface 100) over at least a 0.5 inch×0.25 inch field from a center point, permitting a high resolution scan effectively across a 1.0 inch×0.5 inch area. Of course, it is desirable to have substantially this high a resolution across the entirety of surface 100 of platform 90 to be scanned by laser beam 98, such area being termed the "field of exposure", such area being substantially coextensive with the vision field of a machine vision system employed in the apparatus of the invention as explained in more detail below. The longer and more effectively vertical the path of laser beam 96/98, the greater the achievable resolution.

The sequence of operation and movements of platform 90, cartridges 104a, 104b and their supports 106a, 106b, roller or scraper 102, and laser 92 or another type of fixative head are controlled by computer 82.

Once roller or scraper 102 spreads and smooths material 86 into a first thin layer 108 of substantially uniform thickness (for example, 0.003 to 0.020 inches) over platform 90 or a substrate disposed thereon, laser 92 directs a laser beam 96 toward galvanometer-mounted mirrors 94, which reflect a laser beam 98 toward selected regions of layer 108 in order to affix the particles of material 86 in the selected regions by melting or sintering particles of material 86 to secure adjacent particles of the thermally conductive component of material 86 that are exposed to laser beam 98 to one another. Particles of material 86 in these selected regions of layer 108 are preferably affixed in a regular horizontal pattern representative of a first or lowermost transverse layer or slice of the object to be fabricated, as numerically defined and stored in computer 82. Accordingly, laser beam 98 is directed to impinge on particle layer 108 in those areas where the corresponding layer of the object to be fabricated is comprised of solid material and avoids those areas outside of a periphery of the corresponding layer of the object to be fabricated, as well as those areas of the corresponding layer where a void or aperture exists. Laser beam 98 is withdrawn upon consolidation of material 86 in regions comprising at least the peripheral outline of the corresponding layer of the object being fabricated.

Figure 17:
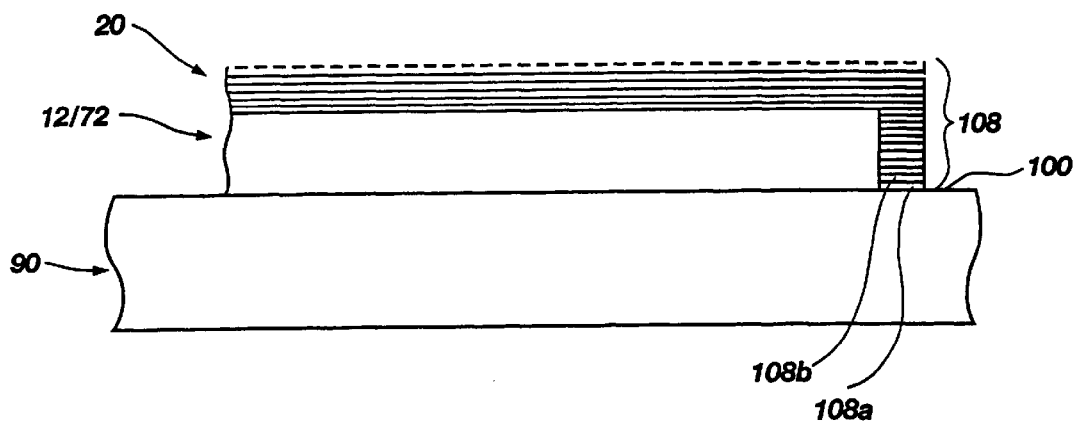
FIG 17 is a partial cross-sectional side view of a semiconductor device or substrate disposed on a platform of a stereolithographic apparatus and depicting a hermetic package being fabricated on the semiconductor device or substrate.
Figure 15:
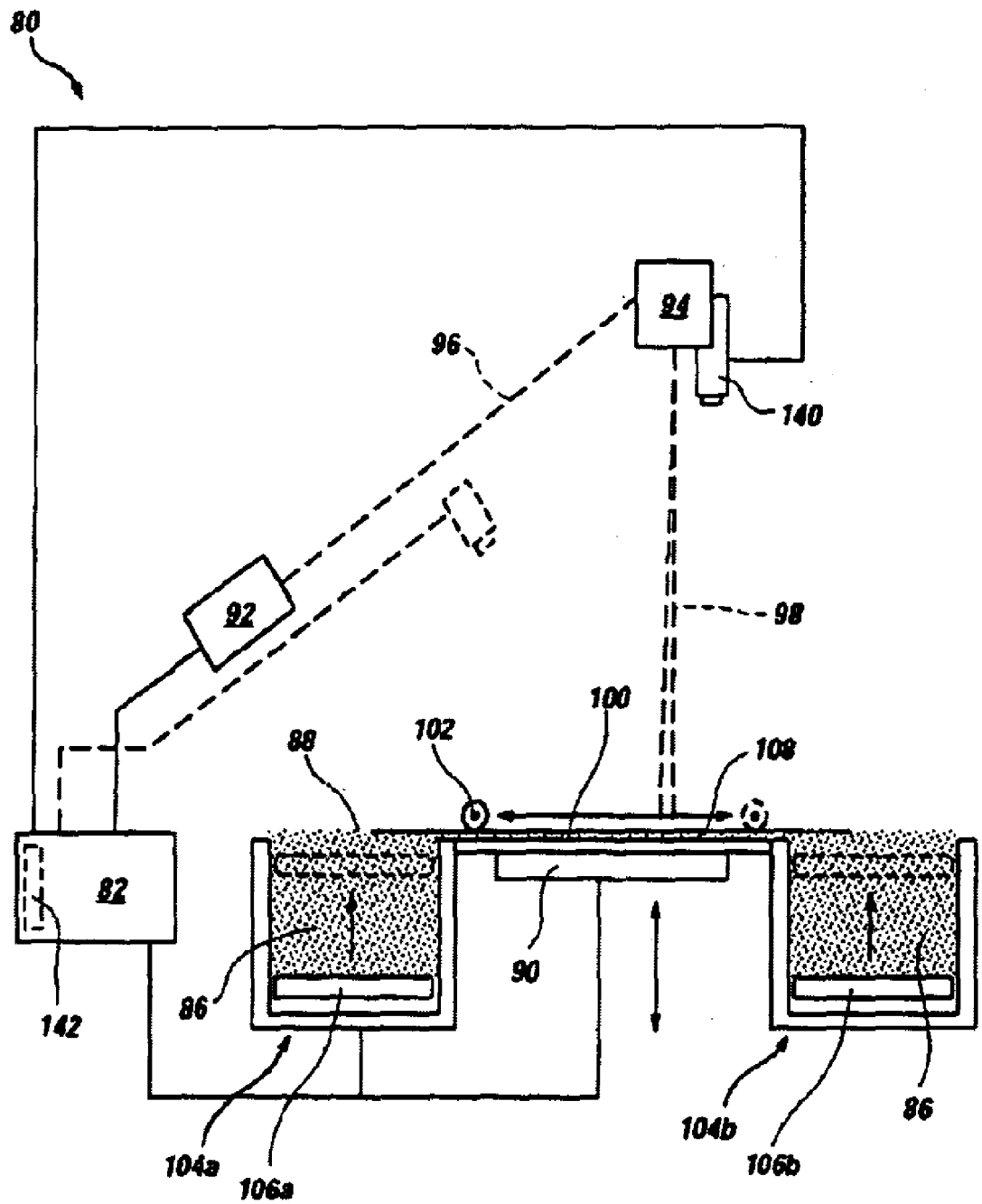

With reference to FIG. 17, when material 86 (FIG. 15) in each of the regions of layer 108 (FIG. 15) that correspond to solid areas of the corresponding layer of the object to be fabricated have been exposed to laser beam 98 (FIG. 15), a first particle layer 108a (FIG. 17), or first preform layer, is formed. First particle layer 108 has at least the peripheral outline of the corresponding layer of the object being fabricated at that vertical or longitudinal level, material 86 within apertures or voids in layer 108 remaining unconsolidated as loose, unfused particles.

Next, platform 90 is indexed downwardly a vertical distance which may or may not be equal to the thickness of the just-fabricated layer 108a (i.e., a layer-manufactured structure may have layers of different thicknesses). Another layer 108b of unconsolidated particulate material 86 is then formed over layer 108b as previously described. Laser beam 98 is then again directed toward selected regions of the new layer 108b to follow a horizontal pattern representative of a next, higher layer or slice of the object to be fabricated, as numerically defined and stored in computer 82. As each successive layer 108 is formed by consolidating material 86 in selected regions, the consolidated material is preferably also secured to the immediately underlying, previously fabricated layer 108. It will be appreciated that, in FIG. 17, the thicknesses of each layer 108 has been exaggerated to clearly illustrate the layered manufacturing process.

Of course, since an object to be fabricated by use of a stereolithography apparatus, such as apparatus 80, may not have uniformly configured and sized cross-sections taken transverse to the length thereof, adjacent layers or slices of the object, while contiguous, may not be identical.

The deposition and smoothing of layers 108 of unconsolidated particles of material 86 and the selective fusing of particles of material 86 in selected regions of each successive layer 108 is continued under control of computer 82 for one or more layers until a recognizable three-dimensional structure gradually emerges, and the layering process is further continued until a completed object has been fabricated. At any time during the fabrication process, or thereafter, unconsolidated particulate material 86 is removed and may be recovered. Any recovered material may be subsequently used to form another object.

As an alternative to the use of a laser to sinter or otherwise bond particles of material 86 in the selected regions of each unconsolidated material layer together to form layers 108a, 108b, an ink jet nozzle or a metal spray gun may be employed as the fixative head. Exemplary apparatus including such fixative heads and exemplary uses thereof are disclosed in the following U.S. Pat. Nos. 5,340,656; 5,387,380; 5,490,882; 5,490,962; 5,518,680; 5,660,621; 5,684,713; 5,775,402; 5,807,437; 5,814,161; 5,851,465; and 5,869,170, each of which have been assigned to the Massachusetts Institute of Technology, Cambridge, Mass. The disclosures of each of the foregoing patents are hereby incorporated by this reference. Such a fixative head deposits a liquid binder (e.g., resin or metal) over the particles of material 86 in selected regions of each layer 108, penetrating therebetween and solidifying, thus bonding particles in the selected regions of layer 108 to at least partially consolidated regions of the next underlying formed layer 108. If an ink jet nozzle is employed as the fixative head, the binder may comprise a nonmetallic binder such as a polymer compound. Alternatively, when a metal spray gun is used as the fixative head, a metallic binder such as a copper or zinc alloy or Kirksite, a proprietary alloy available through Industrial Modern Pattern and Mold Corp., may be employed. In the case of a metal alloy, the binder may be supplied in wire form which is liquified (as by electric arc heating) and sprayed onto the uppermost particulate layer. Another alternative is to liquify the distal end of the binder wire with a laser or other heating means immediately above the unconsolidated powder layer rather than using a metal spray.

Referring again to FIG. 15, in practicing the present invention, a commercially available stereolithography apparatus operating generally in the manner as that described above with respect to apparatus 80 is preferably employed, but with further additions and modifications as hereinafter described for practicing the method of the present invention. For example and not by way of limitation, the SINTERSTATION® 2000, SINTERSTATION® 2500, and SINTERSTATION® 2500 plus stereolithography systems, each offered by DTM Corporation of Austin, Tex., are suitable for modification.

Figure 16:
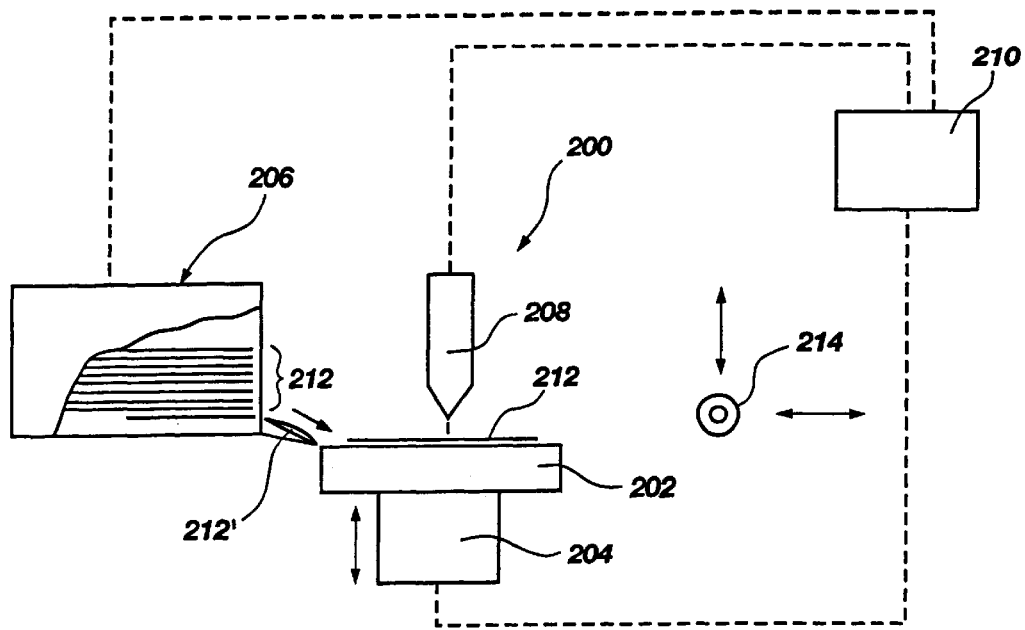
FIG. 16 is a schematic representation of another exemplary stereolithographic apparatus, a laminated object manufacturing apparatus, that can be employed in the method of the present invention to fabricate hermetic packages in accordance with the method of the present invention.

FIG. 16 illustrates a laminated object manufacturing (LOM) variation of the hermetic package fabrication process of the present invention. LOM employs sheets of material to form an object. As depicted in FIG. 16, an apparatus 200 for effecting the LOM method includes a platform 202, actuating means 204 for moving platform 202 in vertical increments, a sheet feeder 206, a laser head 208, and a control computer 210. Sheet feeder 206 may comprise a photocopier-type feeder and provide individual sheets, or may comprise a roll-type feeder with a feed roller and a take-up roller, as desired. In either case, a sheet 212 of suitable material, such as a thin metal (e.g., copper, aluminum, tungsten, titanium, etc.) or a ceramic or glass sheet, is placed on platform 202. Laser head 208, under control computer 210, cuts an outline of the periphery of that layer of the object being fabricated. The surrounding sheet material may then be removed, if desired, and a second, uncut sheet 212' placed over sheet 212 is bonded to sheet 212 by suitable means, after which laser head 208 cuts the perimeter outline of the second layer of the object. If desired, the laser may be used to rapidly heat the second sheet 212' and bond it to the first sheet 212 before second sheet 212' is cut at its periphery. Alternatively, a heated roller 214 may be biased against and rolled over the uppermost second sheet 212' to secure the uppermost second sheet 212' and the immediately adjacent, underlying sheet 212 to each other before the uppermost second sheet 212' is cut to define the periphery of the corresponding layer of the object being fabricated. The embodiment of FIG. 16 is particularly suitable for substantially concurrently forming a large plurality of hermetic packages on the backside of an unsingulated semiconductor wafer or other large-scale substrate.

Such bonding can be effected by melting or sintering, or by an adhesive material disposed on the top, bottom, or both surfaces of each sheet. One or both surfaces of the sheets may be precoated with adhesive, or adhesive may be applied thereto, such as by rolling or spraying, during the layered manufacturing process.

Referring again to FIG. 15, it should be noted that apparatus 80 useful in the method of the present invention may include a camera 140 which is in communication with computer 82 and preferably located, as shown, in close proximity to galvanometer 94 located above surface 100 of support platform 90. Camera 140 may be any one of a number of commercially available cameras, such as capacitive-coupled discharge (CCD) cameras available from a number of vendors. Suitable circuitry as required for adapting the output of camera 140 for use by computer 82 may be incorporated in a board 142 installed in computer 82, which is programmed as known in the art to respond to images generated by camera 140 and processed by board 142. Camera 140 and board 142 may together comprise a so-called "machine vision system" and, specifically, a "pattern recognition system" (PRS), operation of which will be described briefly below for a better understanding of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

Of course, apparatus 200 depicted in FIG. 16 could also be equipped with such a machine vision.

Stereolithographic Fabrication of the Hermetic Packages

Referring again to FIGS. 15 and 17, in order to facilitate fabrication of one or more hermetic packages 20 in accordance with the method of the present invention with apparatus 80, a data file representative of the size, configuration, thickness and surface topography of, for example, a particular type and design of semiconductor die 12 or other substrate on which one or more hermetic packages 20 are to be fabricated is placed in the memory of computer 82. Also, it may be desirable to place a data file representative of the various, features of semiconductor die 12 in memory.

One or more semiconductor dice 12, wafers 72, or other substrates may be placed on surface 100 of platform 90 to have hermetic packages 20 fabricated thereon. Camera 140 is then activated to locate the position and orientation of each semiconductor die 12, including those on a wafer 72, or other substrate. The features of each semiconductor device 10, wafer 72, or other substrate are compared with those in the data file residing in memory, the locational and orientational data for each semiconductor device 10, wafer 72, or other substrate then also being stored in memory. It should be noted that the data file representing the design size, shape and topography for each semiconductor die 12 or other substrate may be used at this juncture to detect physically defective or damaged semiconductor devices 10 or other substrates prior to fabricating a hermetic package 20 thereon or before conducting further processing or assembly of semiconductor die 12 or other substrates. Accordingly, such damaged or defective semiconductor dice 12 or other substrates can be deleted from the stereolithographic hermetic package fabrication process, from subsequent testing, or from assembly with other components. It should also be noted that data files for more than one type (size, thickness, configuration, surface topography) of semiconductor die 12 or other substrate may be placed in computer memory and computer 82 programmed to recognize not only the locations and orientations of each semiconductor die 12 or other substrate, but also the type of semiconductor device 10 or other substrate at each location upon platform 90 so that material 86 may be at least partially consolidated by laser beam 98 in the correct pattern and to the height required to fabricate hermetic packages 20 in the appropriate, desired locations on each semiconductor device 10 or other substrate.

Continuing with reference to FIGS. 15 and 17, a substantially uniform layer 108 of material 86 is disposed over wafer 72 or the one or more semiconductor dice 12 or other substrates on platform 90 to a depth substantially equal to the desired thickness of a formed layer 108 of hermetic package 20.

Laser 92 is then activated and scanned to direct beam 98, under control of computer 82, toward specific locations of surface 88 relative to each semiconductor device 10 or other substrate to effect the aforementioned partial cure of material 86 to form a first layer 108a of each hermetic package 20. Platform 90 is then lowered and another layer 108 of material 86 of a desired thickness disposed over formed layer 108. Laser 92 is again activated to add another layer 108a to each hermetic package 20 under construction. This sequence continues, layer by layer, until each of the layers 108 of each hermetic package 20 have been completed. As illustrated, layers 108 are first formed laterally adjacent edges of a semiconductor die 12 or other substrate, then over one of the major surfaces thereof (e.g., active surface 15 or back side 13). Each semiconductor die 12 or other substrate is then inverted on platform 90 and the remaining layers 108 of hermetic package 20 are formed. Of course, a portion of hermetic package 20 may be prefabricated and disposed on platform 90 prior to the disposal of one or more semiconductor dice 12 thereon. Other stereolithographic fabrication sequences for hermetic packages 20 are, of course, also within the scope of the present invention.

In FIG. 17, the first, bottommost layer of hermetic package 20 is identified by numeral 108a, and the second layer is identified by numeral 108b. As illustrated, hermetic package 20 has only a few layers 108. In practice of the invention, however, hermetic packages 20 may have many thin layers 108. Accordingly, hermetic packages 20 with any number of layers 108 are within the scope of the present invention.

Each layer 108 of hermetic package 20 may be built by first defining any internal and external object boundaries of that layer with laser beam 98, then hatching solid areas of that layer of hermetic package 20 located within the object boundaries with laser beam 98. An internal boundary of a layer may comprise a portion, a void or a recess in hermetic package 20, for example. If a particular layer includes a boundary of a void in the object above or below that layer, then laser beam 98 is scanned in a series of closely spaced, parallel vectors so as to develop a continuous surface, or skin, with improved strength and resolution. The time it takes to form each layer 108 depends upon the geometry thereof, the surface tension and viscosity of material 86, and the thickness of that layer.

Figure 18:
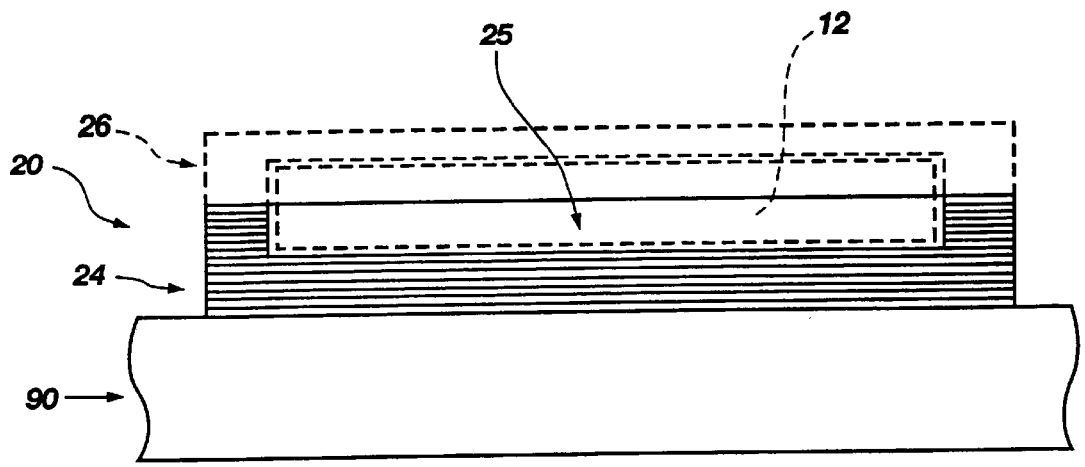
FIG. 18 is a schematic representation of a variation of the method illustrated in FIGS. 15 and 17, wherein the hermetic package has two portions or sections.

With reference to FIG. 18, in embodiments where it is desirable to form a hermetic package 20 completely around semiconductor die 12 or another substrate, a first portion 24 of hermetic package 20 may be provided on platform 90. First portion 24 may include a receptacle 25 configured to receive semiconductor die 12 or another substrate prior to the stereolithographic fabrication of the remainder, or a second portion 26, of hermetic package 20 around the remaining surfaces of semiconductor die 12 or the other substrate. Alternatively, first portion 24 may have a substantially planar surface on which semiconductor device 10 is to be disposed prior to fabricating the remainder of hermetic package 20. First portion 24 may be fabricated stereolithographically or otherwise, as known in the art.

Of course, it is the purpose of every embodiment of a substantially hermetic package incorporating teachings of the present invention to protect the semiconductor device or devices enclosed therein. Accordingly, it may be desirable to drive reactive gases, such as oxygen and hydrogen, out of a package and, thus, away from the semiconductor device or devices therein, prior to sealing the hermetic package. As an example of the manner in which reactive gases may be substantially removed within the confines of a substantially hermetic package, the hermetic packages or at least the final layers thereof may be fabricated in an inert atmosphere, such as an atmosphere containing nitrogen or other inert gases.

Referring again to FIGS. 15 and 17, once hermetic packages 20 have been fabricated, platform 90 is elevated and removed from apparatus 80, along with any substrate (e.g., semiconductor die 12, wafer 72 (see FIG. 8), or other substrate) disposed thereon and any stereolithographically fabricated structures, such as hermetic package 20. Excess, unconsolidated material 86 (e.g., excess powder or particles) may be manually removed from platform 90, from any substrate disposed thereon, and from hermetic package 20. Each hermetically packaged semiconductor device 10 or other substrate is removed from platform 90.

Residual particles of the material that was used to fabricate hermetic package 20 are preferably removed by use of known solvents or other cleaners that will not substantially degrade, deform, or damage hermetic package 20 or the substrate (e.g., semiconductor die 12) on which hermetic package 20 was fabricated. Such cleaning is particularly important when electrically conductive materials, such as metals, are used to fabricate hermetic package 20, as a residue of such electrically conductive materials can cause electrical shorts that may result in failure of semiconductor die 12.

Although FIGS. 15–18 illustrate the stereolithographic fabrication of hermetic package 20 on a substrate, such as a semiconductor die 12, a wafer 72, or another substrate, hermetic package 20 or a portion thereof can be fabricated separately from a substrate, then assembled with the substrate by known processes.

The use of a stereolithographic process as exemplified above to fabricate hermetic package 20 is particularly advantageous since a large number of hermetic packages 20 may be fabricated in a short time, the dimensions and positions thereof are computer-controlled to be extremely precise, wastage of packaging material 86 is minimal, and the stereolithography method requires minimal handling of semiconductor dice 12, wafers 72, or other substrates.

Stereolithography is also an advantageous method of fabricating hermetic packages according to the present invention since, when resinous binders are used to secure adjacent particles of thermally conductive material in selected regions, stereolithography can be conducted at substantially ambient temperature, the small spot size and rapid traverse of laser beam 98 resulting in negligible thermal stress upon semiconductor devices 10, wafers 72, or other substrates, as well as on the features thereof.

The stereolithography fabrication process may also advantageously be conducted at the wafer level or on multiple substrates, saving fabrication time and expense. As the stereolithography method of the present invention recognizes specific semiconductor devices 10 or other substrates, variations between individual substrates are accommodated. Accordingly, when the stereolithography method of the present invention is employed, hermetic packages 20 can be simultaneously fabricated on different types of semiconductor dice 12 or other substrates, as well as on both semiconductor devices 10 and other substrates.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of fabricating a substantially hermetic package, comprising:
   placing at least one semiconductor device with a surface thereof in a horizontal plane;
   recognizing a location and orientation of said surface of said at least one semiconductor device; and
   stereolithographically fabricating a substantially hermetic package on said surface of said at least one semiconductor device, said substantially hermetic package comprising at least one layer of at least partially consolidated hermetic packaging material.

2. The method of claim 1, further comprising storing data including at least one physical parameter of said at least one semiconductor device and of said substantially hermetic package in computer memory, and using the stored data in conjunction with a machine vision system to recognize a location and orientation of at least one of said at least one semiconductor device and said surface thereof.

3. The method of claim 2, further comprising using the stored data, in conjunction with said machine vision system, to effect said stereolithographically fabricating.

4. The method of claim 1, further including securing said at least semiconductor device to a carrier prior to placing the surface of the at least one semiconductor device in said horizontal plane.

5. The method of claim 1, further comprising:
   flipping said at least one semiconductor device; and
   stereolithographically fabricating at least one additional layer of said substantially hermetic package on another surface of said at least one semiconductor device.

6. The method of claim 5, wherein said stereolithographically fabricating said at least one additional layer comprises securing said at least one additional layer to a previously formed layer of said substantially hermetic package.

7. The method of claim 6, wherein said securing said at least one additional layer to said previously formed layer of said substantially hermetic package comprises substantially encapsulating said at least one semiconductor device.

8. The method of claim 1, wherein said stereolithographically fabricating comprises:
   forming a layer of unconsolidated hermetic packaging material;
   at least partially selectively consolidating said hermetic packaging material of said layer in selected regions; and
   repeating said forming said layer and said at least partially selectively consolidating until all surfaces of the at least one semiconductor device are substantially covered with at least partially consolidated hermetic packaging material.

9. The method of claim 1, wherein said stereolithographically fabricating comprises:
   providing a sheet of hermetic packaging material; and
   defining at least boundaries of a corresponding, first layer of the substantially hermetic package in said sheet.

10. The method of claim 9, wherein said stereolithographically fabricating further comprises:
    providing at least one additional sheet of hermetic packaging material; and
    defining at least boundaries of an additional, corresponding layer of the substantially hermetic package in said at least one additional sheet.

11. The method of claim 9, wherein said defining comprises laser-cutting.

12. The method of claim 9, wherein said providing said sheet comprises providing a sheet of thermoplastic glass.

13. The method of claim 1, wherein said stereolithographically fabricating is effected until said at least one semiconductor device is substantially encapsulated by hermetic packaging material.

14. The method of claim 1, wherein said placing comprises placing an assembly including at least one semiconductor die and at least one carrier substrate in said horizontal plane.

15. The method of claim 1, wherein said placing comprises placing an assembly including at least one semiconductor die and at least one lead frame in said horizontal plane.

16. The method of claim 1, wherein said placing comprises placing at least one substantially bare semiconductor die in said horizontal plane.

17. The method of claim 16, wherein said placing said at least one substantially bare semiconductor die comprises placing a semiconductor substrate bearing a plurality of substantially bare semiconductor dice locations in said horizontal plane.

18. The method of claim 17, wherein said stereolithographically fabricating is effected on a first side of said semiconductor substrate, said hermetic packaging material substantially covering said first side of said semiconductor substrate.

19. The method of claim 18, further comprising inverting said semiconductor substrate and removing material of said semiconductor substrate between adjacent semiconductor dice at least down to said hermetic packaging material, said hermetic packaging material maintaining positions of said adjacent semiconductor dice.

20. The method of claim 19, wherein said removing comprises sawing said semiconductor substrate along streets located between said adjacent semiconductor dice.

21. The method of claim 19, wherein said removing comprises etching said semiconductor substrate along streets located between said adjacent semiconductor dice.

22. The method of claim 19, further comprising:
    disposing at least partially consolidated hermetic packaging material between said adjacent semiconductor dice and on an active surface of each of said semiconductor dice to form a plurality of substantially hermetically packaged semiconductor dice.

23. The method of claim 22, further comprising:
    singulating at least some of said plurality of substantially hermetically packaged semiconductor dice from said semiconductor substrate.

24. The method of claim 22, further comprising:
    exposing at least one bond pad on an active surface of at least one of said plurality of substantially hermetically packaged semiconductor dice.

25. The method of claim 24, wherein said exposing comprises etching a region of an at least partially consolidated hermetic packaging material located above said at least one bond pad.

26. The method of claim 24, further comprising:
    fabricating at least one conductive trace on said substantially hermetic package and in communication with said at least one bond pad.

* * * * *

UNITED STATES PATENT AND TRADEMARK OFFICE
CERTIFICATE OF CORRECTION

| | | |
|---|---|---|
| PATENT NO. | : 6,593,171 B2 | Page 1 of 3 |
| DATED | : July 15, 2003 | |
| INVENTOR(S) | : Warren M. Farnworth | |

It is certified that error appears in the above-identified patent and that said Letters Patent is hereby corrected as shown below:

Drawings,
Figure 15, relocate reference numeral 100 and redirect the lead line extending therefrom to rest upon the top surface of platform 90 as shown on attached page.

Column 1,
Line 12, change "752." to -- 752, issued Aug. 13, 2002. --.

Column 2,
Lines 36, 43, 45 and 47, change "'100" to -- '100 --.

Column 7,
Line 52, change "is therefor" to -- is, therefore, --.

Column 9,
Line 7, change "101A" to -- 110A --.
Line 8, change "layers," to -- layers --.

Column 10,
Line 3, change "die 12" to -- dice 12 --.

Column 11,
Line 36, change "protection the" to -- protection to the --.

Column 12,
Line 9, delete "5,332,051;".
Line 11, delete "5,673,258;".
Line 60, change "inches)" to -- inch) --.

UNITED STATES PATENT AND TRADEMARK OFFICE
CERTIFICATE OF CORRECTION

PATENT NO.    : 6,593,171 B2
DATED         : July 15, 2003
INVENTOR(S)   : Warren M. Farnworth It is certified that error appears in the above-identified patent and that said Letters Patent is hereby corrected as shown below:

Column 13,
Line 38, change "if level 88" to -- if surface level 88 --.
Line 60, change "inches)" to -- inch) --.

Column 14,
Line 19, change "First particle layer 108" to -- First particle layer 108a --.

Column 16,
Line 33, change "machine vision." to -- machine vision system. --.

Coumn 17,
Line 16, change "direct beam 98," to -- direct laser beam 98, --.
Line 23, change "layer 108." to -- layer 108a. --.
Line 24, change "108a" to -- 108b --.
Line 30, change "back side 13)." to -- backside 13). --.

Signed and Sealed this

Thirtieth Day of May, 2006

JON W. DUDAS
*Director of the United States Patent and Trademark Office*